United States Patent [19]

Kariya et al.

[11] Patent Number: 4,785,187
[45] Date of Patent: Nov. 15, 1988

[54] ALIGNMENT DEVICE

[75] Inventors: Takao Kariya, Akikawa; Susumu Goto, Hachiohji; Masahiko Okunuki, Tokyo, all of Japan

[73] Assignee: Canon Kabushiki Kaisha, Tokyo, Japan

[21] Appl. No.: 134,532

[22] Filed: Dec. 15, 1987

Related U.S. Application Data

[63] Continuation of Ser. No. 073,308, Jul. 13, 1987, abandoned, which is a continuation of Ser. No. 935,127, Nov. 26, 1986, abandoned, which is a continuation of Ser. No. 713,560, Mar. 19, 1985, abandoned.

[30] Foreign Application Priority Data

Mar. 27, 1984 [JP] Japan .................. 59-57211

[51] Int. Cl.$^4$ .............................................. H01J 37/20
[52] U.S. Cl. ................. 250/491.1; 250/492.2; 378/34
[58] Field of Search ............ 250/491.1, 492.2, 397; 378/34

[56] References Cited

U.S. PATENT DOCUMENTS

| | | | |
|---|---|---|---|
| 3,710,101 | 1/1973 | O'Keeffe | 250/49.5 |
| 3,745,358 | 7/1973 | Firtz | 250/365 |
| 3,864,597 | 2/1975 | Trotel | 250/491.1 |
| 3,879,613 | 4/1975 | Scott | 250/492 |
| 3,894,271 | 7/1975 | Pfeiffer | 315/384 |
| 4,119,854 | 10/1978 | Tanaka et al. | 250/397 |
| 4,370,554 | 1/1983 | Bohlen et al. | 250/491.1 |
| 4,413,187 | 11/1983 | Akazawa | 250/491.1 |
| 4,472,824 | 9/1984 | Buckley | 378/34 |
| 4,578,587 | 3/1986 | Behringer | 250/492.2 |

Primary Examiner—Bruce C. Anderson
Assistant Examiner—Jack I. Berman
Attorney, Agent, or Firm—Fitzpatrick, Cella, Harper & Scinto

[57] ABSTRACT

An alignment device including an electron gun for emitting an electron beam, a deflecting electrode for scanningly deflecting the electron beam emitted from the electron gun, a holder for holding an object in a plane of scan, a reference mark with which the object is to be aligned, and a detector for detecting electron beams emerging from the reference mark and the object, which are irradiated by the scanning electron beam, to detect the position of each of the reference mark and the object. On the basis of result of detection by the detector, the object is displaced by a drive source, whereby it is precisely aligned with the reference mark.

6 Claims, 1 Drawing Sheet

ALIGNMENT DEVICE

This application is a continuation of application Ser. No. 73,308 filed 7/13/87, now abandoned, which was a continuation of application Ser. No. 935,127 filed 11/26/86, now abandoned, which was a continuation of application Ser. No. 713,560 filed 3/19/85, now abandoned.

BACKGROUND OF THE INVENTION

This invention relates to an alignment device and, more particularly, to an alignment device for use in a semiconductor circuit manufacturing apparatus having a resolving power capable of transferring a fine pattern having a minimum line width of an order of a submicron.

Among various types of exposure apparatuses usable as the semiconductor circuit manufacturing apparatuses, X-ray exposure apparatuses have become attractive because of their capability of transferring minute patterns having a minimum line width of the order of 0.5 micron or less and because throughputs as high as conventional optical exposure apparatuses are estimated.

Use of X-rays has been proposed also in the field of alignment between a mask and a wafer to be used in conventional optical exposure apparatuses or in the X-ray exposure apparatuses. However, the alignment through the X-rays is not yet practicable and, usually, reflection or diffraction of light is utilized. In the optical alignment, the light beam for alignment has a large diameter of approximately 10 microns and the surface of the wafer usually contains irregularities which cause scatter or irregular reflection of light. For these reasons, it is not so easy to stably obtain appropriate reflection light from alignment marks, which makes it difficult to achieve alignment of high accuracies of the order of 0.01 micron. This in turn leads to difficulties in accurately overlying patterns having minimum line width of the order of a submicron.

SUMMARY OF THE INVENTION

It is accordingly a primary object of the present invention to provide an improved alignment device capable of accurately aligning a wafer with a mask having formed thereon a fine pattern having a minimum line width of the order of a submicron.

It is another object of the present invention to provide an improved alignment device usable with an X-ray exposure apparatus, for aligning a mask and a wafer.

It is a further object of the present invention to provide an improved alignment device using an electron beam for accurately aligning a mask and a wafer for use in the manufacture of semiconductor circuit devices.

Briefly, according to the present invention, there is provided an alignment device including an electron gun for emitting an electron beam, a deflecting electrode for scanningly deflecting the electron beam emitted from the electron gun, a holder for holding an object in a plane of scan, a reference mark with which the object is to be aligned, and a detector for detecting electrons emerging from the reference mark and the object, which are irradiated by the scanning electron beam, to detect the position of each of the reference mark and the object. On the basis of result of detection by the detector, the object is displaced by a drive source, whereby it is precisely aligned with the reference mark.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
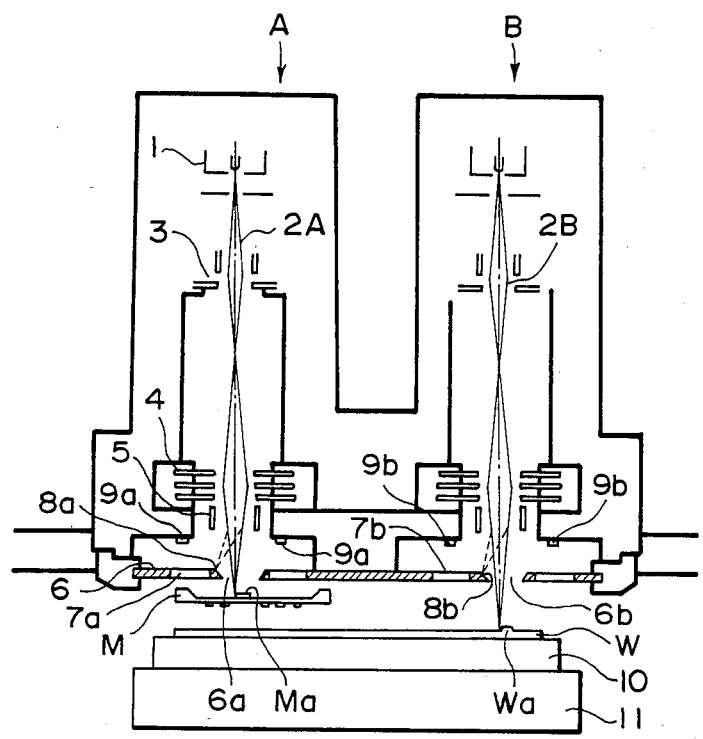
FIG. 1 is a sectional view schematically showing an alignment device according to an embodiment of the present invention.

FIG. 1 shows an alignment device according to an embodiment of the present invention, which is arranged to align a mask M with a wafer W for use in the manufacture of semiconductor circuit devices.

The alignment device shown in FIG. 1 includes an electron microscope A for mask alignment and another electron microscope B for wafer alignment. These electron microscopes A and B are formed as a unit in order to prevent occurrence of any positional error relative to each other. The electron microscopes A and B have essentially the same structure, as will be decribed below.

That is, each of the electron microscopes A and B includes an electrn gun 1 for emitting an electron beam 2A or 2B, a condenser lens 3, an objective lens 4 and a deflecting electrode 5. The electron beam 2A or 2B emitted by the electron gun 1 is converged by the condenser lens 3 and by the objective lens 4, and is scanningly deflected by the deflecting electrode 5 in the direction X. With this arrangement, each of the electron beams 2A and 2B can be easily focused to have a beam diameter of the order of approximately 0.1 micron which is equal to or less than one-tenth of the diameter of the light beam in the optical alignment. The scanningly deflected electron beams 2A and 2B scan, respectively, the surfaces of the mask M and wafer W to detect any misalignment or relative positional deviation between the mask and wafer, which will be described later. The mask M is formed by a material which is transmissive to the X-rays but is non-transmissive to the electron beams.

At the lower portions of the electron microscopes A and B, one single reference plate 6 is fixedly secured. The reference plate 6 has formed therein slits or apertures 6a and 6b for passing therethrough the electron beams 2A and 2B, respectively, emitted from the respective electron guns 1, 1 and slits or apertures 7a and 7b for passing therethrough reflected electron beams which will be described later. The reference plate 6 is made of a material, such as quartz ($SiO_2$) or Invar, which has a low thermal expansion coefficient and which is thermally stable.

Also, the reference plate 6 is provided with reference marks 8a and 8b which are precisely formed at the positions close to the apertures 6a and 6b, respectively. The interval between the reference marks 8a and 8b defines a reference distance.

Mounted fixedly on the lower portions of the electron microscopes A and B are detectors 9a, 9a, 9b and 9b for detecting the reflected electron beams. The detectors 9a and 9a are provided to detect the electron beams reflected from the reference mark 8a and from the mask M, while the detectors 9b and 9b are provided to detect the electron beams reflected from the reference mark 8b and from the wafer W.

While taking into account the positions of the detectors 9a-9b and the dimensions of the wafer W to be used, etc. the reference marks 8a and 8b are precisely formed at accurate positions on the reference plate 6 in order to define an accurate reference distance as described above. Each of the reference marks 8a and 8b is formed of a material, such as Au or the like, which is reflective relative to the electron beam and which has a sufficient strength to resist breakage due to repeated irradiation of the electron beam.

The mask M is formed with an alignment mark Ma and is carried by an unshown mask chuck in a proximity relation to the wafer W. The mask M is movable horizontally (i.e. in the directions of X and Y) for the sake of die-by-die exposure of the wafer W. Similarly, the wafer W is formed with a corresponding alignment mark Wa and is adapted to be moved horizontally (i.e. in the directions of X and Y) by means of a wafer stage 11 carrying thereon the wafer W.

In operation, each of the electron beams 2A and 2B emitted from the respective electron guns 1, 1 passes through the condenser lens 3 and the objective lens 4 and is scanningly deflected by the deflecting electrode 5 so that it scans the reference mark 8a (or 8b) on the reference plate 6 and the alignment mark Ma on the mask M (or the alignment mark Wa on the wafer W). At this time, beam scanning signals to be supplied to the deflecting electrodes 5, 5 of the electron microscopes A and B, respectively, are synchronized with each other.

During the electron beam scanning, there occur reflection electrons emerging from the reference mark 8a and from the alignment mark Ma of the mask M in the case of the electron microscope A, and there occur reflection electrons emerging from the reference mark 8b and from the alignment mark Wa of the wafer W in the case of the electron microscope B. These reflection electrons are detected by corresponding ones of the pairs of detectors 9a-9b. As the result, a distance between the reference mark 8a and the alignment mark Ma and the distance between the reference mark 8b and the alignment mark Wa are detected as a function of the scanning speed of the electron beam. Since the reference distance between the reference marks 8a and 8b is determined or fixed, misalignment between the mask M and wafer W in the direction X can be detected.

In order to detect the misalignment between the mask M and wafer W in the directions of Y and $\theta$ (rotational direction), each of the electron microscopes A and B is provided with an additional deflecting electrode (not shown in the drawing) for scanningly deflecting the electron beam 2A (or 2B) in the direction Y. After the misalignment between the mask and wafer in the directions X, Y and $\theta$ is detected, one or both of the unshown mask stage and the wafer stage 11 are displaced relative to the reference plate 6 until a correct positional relation to the reference plate 6 is established. When this is achieved, the mask M and wafer W are aligned with each other in a predetermined positional relation, through the reference plate 6.

Subsequently, the mask M and wafer W are moved to the exposure station while maintaining the relative positional relation therebetween.

Figure 2:
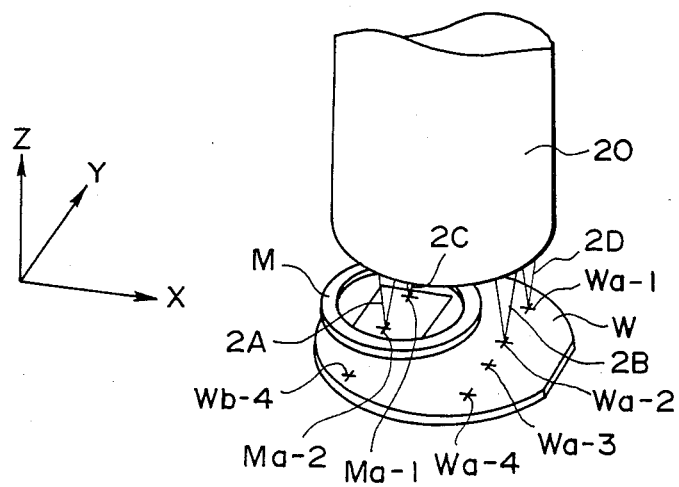
FIG. 2 is a fragmentary perspective view showing the alignment device of FIG. 1.

FIG. 2 shows an alignment device according to another embodiment of the present invention. In order to achieve higher alignment accuracies, it is preferable to detect the misalignment between the mask and wafer with respect to two points for each of the mask and wafer, i.e. four points for the mask and wafer.

In view of this, the alignment device according to the second embodiment of the present invention and shown in FIG. 2 is provided with four electron microscopes which are made as a unit and are accommodated in a common housing 20. Each of the four microscopes has substantially the same structure as each microscope of the FIG. 1 device, so that the alignment device of FIG. 2 supplies four electron beams 2A, 2B, 2C and 2D each of which can be scanningly deflected in the direction X.

The alignment device of the present embodiment includes one single reference plate (not shown) which is similar to the reference plate 6 of FIG. 1 embodiment but which has formed therein four slits or apertures (like the apertures 6a and 6b of FIG. 1) for passing therethrough the electron beams 2A-2D, respectively, as well as four slits or apertures (like the apertures 7a and 7b of FIG. 1) for transmitting therethrough the reflection electrons. Further, the reference plate has formed thereon four reference marks (like the reference marks 8a and 8b of FIG. 1) which are accurately disposed in an exact rectangular relation. Thus, an exact reference distance in the direction X is defined by each pair of reference marks juxtaposed in the direction X, while an exact reference distance in the direction Y is defined by each pair of reference marks juxtaposed in the direction Y.

As shown in FIG. 2, the mask M has formed thereon two alignment marks Ma-1 and Ma-2 which are preferably spaced from each other through a distance exactly the same as the reference distance defined between two reference marks of each pair juxtaposed in the direction Y as described above. On the other hand, the wafer W has formed thereon alignment marks Wa-1 and Wa-2 juxtaposed in the direction X and spaced from each other through a distance exactly the same as the distance between the alignment marks Ma-1 and Ma-2 on the mask.

In operation, the electron beam 2A scans an associated one of the four reference marks on the reference plate as well as the alignment mark Ma-2 on the mask, in the direction X. Similarly, the electron beam 2B scans an associated one of the reference marks on the reference plate as well as the alignment mark Wa-2 on the wafer W; the electron beam 2C scans an associated one of the reference marks as well as the alignment mark Ma-1 on the mask M; and the electron beam 2D scans the remaining reference mark as well as the alignment mark Wa-1 on the wafer W, all in the direction X. The electrons reflected by the four reference marks and by the four alignment marks are detected, respectively, by four sets of detectors fixedly secured, respectively, to the lower portions of the four microscopes, whereby the distance between each of the reference marks and an associated one of the alignment marks in the direction X is detected. By this, any misalignment between the mask M and wafer W in the directions of X, Y and $\theta$ can be detected.

On the basis of the results of the detection of misalignment, both or one of the mask M and wafer W are displaced relative to the reference plate until a correct positional relation to the reference plate is established. When this is achieved, the mask M and wafer W are aligned with each other in a predetermined positional relation, through the reference plate, as in the FIG. 1 embodiment.

Thereafter, the mask M and wafer W are moved to the exposure station while maintaining the positional relation therebetween.

As regards the alignment between the mask M and wafer W with respect to another pattern-transfer region on the wafer W juxtaposed, in the direction Y in FIG. 2, to the pattern transfer region located under the mask M in the FIG. 2 position, the wafer W is moved in the direction Y relative to the mask M and to the reference plate and then the alignment is achieved by using alignment marks Wa-3 and Wa-4 of the wafer W as well as the alignment marks Ma-1 and Ma-2 of the same mask M, in a similar manner as has been described in the foregoing.

The wafer has also formed thereon additional four alignment marks (only one, Wb-4, of which is shown in FIG. 2). These additional marks are used for the purpose of alignment with respect to another pair of pattern transfer regions, respectively, which are juxtaposed in the direction Y and are opposed to the pattern transfer regions on the left-hand side of the wafer W as viewed in FIG. 2.

Each of the four sets of alignment marks on the wafer W, each set comprising two alignment marks, can be formed on the wafer, e.g., by using a mask having alignment marks which are exactly the same as the alignment marks Ma-1 and Ma-2. First, the two alignment marks of such mask are aligned, respectively, with corresponding two reference marks on the reference plate juxtaposed with each other in the direction Y and then the mask and wafer are moved to the exposure station while maintaining a fixed positional relation therebetween. Thus, after exposure, the alignment marks on the mask are transferred onto the wafer. Similarly, another set of alignment marks can be formed on the wafer by aligning the wafer with the reference plate by means of the transferred alignment marks and by aligning the mask with respect to the remaining two reference marks juxtaposed in the direction Y. In such a case, the mask having the two alignment marks may be formed with a circuit pattern.

While in the foregoing embodiments the electrons reflected from the marks are detected to detect any misalignment between the mask and the wafer, secondary electrons may be detected in place of the reflection electrons. Further, the reference plate for setting the reference distance is not always necessary, and the reference marks may be directly formed, respectively, on the lower portions of the electron microscopes in the vicinity of the mask or wafer.

Further, the electron beams used in the foregoing embodiments may be replaced by ion beams.

In accordance with the present invention, as has hitherto been described, alignment of an accuracy of the order of approximately 0.01 micron is assured. Further, plural points spaced from each other through a distance which exceeds the scanning range of an electron microscopic system can be detected. For these reasons, the alignment device according to the present invention is effective to be applied to an X-ray exposure apparatus or the like for transferring a very fine pattern.

While the invention has been described with reference to the structures disclosed herein, it is not confined to the details set forth and this application is intended to cover such modifications or changes as may come within the purposes of the improvements or the scope of the following claims.

What is claimed is:

1. An alignment device comprising:
   a reference having a reference mark for use in the alignment of an object:
   means including an electron beam for scanning said reference mark and an alighment mark provided on the object;
   means for detecting electrons from said reference mark and from the alignment mark scanned with the electron beam; and
   means for moving the object relative to the reference on the basis of the electron detection performed by said detecting means.

2. A device according to claim 1, further comprising means for converging the electron beam.

3. A device according to claim 2, wherein said converging means comprises a condenser lens and an objective lens.

4. A device according to claim 3, wherein said means for scanning includes a deflecting electrode.

5. A device for aligning a first object and a second object with each other, said device comprising:
   reference means having a first reference mark and a second reference mark for the use in the alignment of the first and second objects;
   first scanning means including an electron beam for scanning said first reference mark and the first object;
   second scanning means including an electron beam for scanning said second reference mark and the second object;
   means for detecting electrons from the first and second objects and from said first and second reference marks; and
   means for moving at least one of the first and second objects on the basis of the electron detection performed by said detecting means so as to relatively align the first and second objects.

6. A device for aligning a mask having a pattern with a wafer onto which the pattern of the mask is to be transferred, said device comprising:
   first reference means having a first reference mark for use in the alignment of the mask;
   second reference means having a second reference mark for use in the alignment of the wafer, said second reference means located in a substantially fixed position relative to the first reference means;
   first scanning means including an electron beam for scanning said first reference mark and the mask;
   second scanning means including an electron beam for scanning said second reference mark and the wafer;
   means for detecting electrons from the mask and the wafer and from said first and second reference marks; and
   means for moving at least one of the mask and the wafer on the basis of the electron detection performed by said detecting means so as to relatively align the mask and wafer.

* * * * *

UNITED STATES PATENT AND TRADEMARK OFFICE
CERTIFICATE OF CORRECTION

PATENT NO. : 4,785,187
DATED : November 15, 1988
INVENTOR(S) : TAKAO KARIYA, ET AL.

Page 1 of 2

It is certified that error appears in the above-identified patent and that said Letters Patent is hereby corrected as shown below:

IN [75] INVENTORS

"Takao Kariya, Akikawa; Susumu Goto, Hachiohji; Masahiko Okunuki, Tokyo, all of Japan" should read --Takao Kariya; Susumu Goto; Masahiko Okunuki, all of Tokyo, Japan--.

COLUMN 2

Line 31, "electrn gun 1" should read --electron gun 1--.

COLUMN 3

Line 42, "the result, a" should read --a result, the--.

COLUMN 4

Line 6, "and" should read --as--.

UNITED STATES PATENT AND TRADEMARK OFFICE
CERTIFICATE OF CORRECTION

PATENT NO. : 4,785,187

DATED : November 15, 1988

INVENTOR(S) : TAKAO KARIYA, ET AL.

It is certified that error appears in the above-identified patent and that said Letters Patent is hereby corrected as shown below:

COLUMN 6

Line 10, "alighment" should read --alignment--.

Signed and Sealed this

Fourth Day of July, 1989

Attest:

DONALD J. QUIGG

Attesting Officer

Commissioner of Patents and Trademarks